United States Patent
Hanrieder et al.

(10) Patent No.: US 7,315,951 B2
(45) Date of Patent: Jan. 1, 2008

(54) HIGH SPEED NON-VOLATILE ELECTRONIC MEMORY CONFIGURATION

(75) Inventors: Paul Hanrieder, Calgary (CA); Marc L. Graves, Calgary (CA); Ken R. M. Hambly, Airdrie (CA)

(73) Assignee: Nortel Networks Corporation, St. Laurent, Quebec ( * ) Notice: Subject to any disclaimer, the term of this patent is extended or adjusted under 35 U.S.C. 154(b) by 406 days.

(21) Appl. No.: 10/811,913

(22) Filed: Mar. 30, 2004

(65) Prior Publication Data

US 2005/0091547 A1  Apr. 28, 2005

Related U.S. Application Data

(60) Provisional application No. 60/514,524, filed on Oct. 27, 2003.

(51) Int. Cl.
*G06F 1/00* (2006.01)
*G06F 11/30* (2006.01)

(52) U.S. Cl. .................. 713/300; 713/340; 711/162

(58) Field of Classification Search ............... 713/300, 713/340; 711/162
See application file for complete search history.

(56) References Cited

U.S. PATENT DOCUMENTS

| | | | |
|---|---|---|---|
| 4,763,333 A * | 8/1988 | Byrd | 714/22 |
| 5,197,026 A * | 3/1993 | Butler | 365/185.22 |
| 5,235,700 A * | 8/1993 | Alaiwan et al. | 714/13 |
| 5,412,612 A * | 5/1995 | Oyama | 365/228 |
| 6,170,044 B1 * | 1/2001 | McLaughlin et al. | 711/162 |
| 6,263,398 B1 * | 7/2001 | Taylor et al. | 711/3 |
| 6,336,174 B1 * | 1/2002 | Li et al. | 711/162 |
| 6,496,939 B2 * | 12/2002 | Portman et al. | 713/340 |
| 6,990,603 B2 * | 1/2006 | Strasser | 714/6 |
| 7,143,298 B2 * | 11/2006 | Wells et al. | 713/300 |
| 2005/0268157 A1 * | 12/2005 | Campanale | 714/5 |

OTHER PUBLICATIONS

Olaf Pfeiffer and Andy Ayre, "Using Flash Memory in Embedded Applications", published 2000, available at http://www.esacademy.com/faq/docs/flash/lifetime.htm, pp. 1-2.*

* cited by examiner

*Primary Examiner*—Thomas Lee
*Assistant Examiner*—Ji H Bae
(74) *Attorney, Agent, or Firm*—Hunton & Williams LLP

(57) ABSTRACT

A high speed non-volatile electronic memory configuration and method is disclosed. In one particular exemplary embodiment, the high speed non-volatile electronic memory configuration may be realized comprising a high speed volatile memory, a non-volatile memory coupled to the high speed volatile memory, a controller coupled to the high speed volatile memory and the non-volatile memory, and a power level detector that detects when power is above a particular minimum operating voltage level. The controller monitors data storage changes made within the high speed volatile memory and controls the transfer of stored data from the high speed volatile memory to the non-volatile memory, and vice-versa, when power is above the particular minimum operating voltage level.

20 Claims, 2 Drawing Sheets

HIGH SPEED NON-VOLATILE ELECTRONIC MEMORY CONFIGURATION

CROSS-REFERENCE TO RELATED APPLICATIONS

This patent application claims priority to U.S. Provisional Patent Application No. 60/514,524, filed Oct. 27, 2003, which is hereby incorporated by reference herein in its entirety.

FIELD OF THE INVENTION

The present invention relates generally to electronic memory configurations and, more particularly, to a high speed non-volatile electronic memory configuration and method.

BACKGROUND OF THE INVENTION

A critical requirement in many electronic system designs is an ability to retrieve data that has been saved in electronic memory configuration when a power failure or other power reduction event occurs. Such a power reduction event may occur, for example, as a result of a total system power failure or merely a temporary drop in a specified system power level. In any event, such a power reduction event typically causes data that has been stored in an electronic memory configuration to be lost, unless the electronic memory configuration is a non-volatile electronic memory configuration. However, non-volatile electronic memory configurations are typically very expensive and/or too slow to accommodate data storage requirements. Regarding the latter, flash memory devices, for example, are non-volatile in nature, but the speed at which they store data is too slow to be used as a primary memory in most high-speed electronic systems. Regarding the former, non-volatile electronic memory configurations typically require multiple components, some of which are typically very costly price-wise, while the combination of which are typically very costly in terms of physical circuit board space.

For example, referring to FIG. 1, there is shown a conventional non-volatile electronic memory configuration 100 comprising a high speed, low power, static random access memory device (SRAM) 102, a signal switch 104, a power switch 106, a voltage detector 108, and an auxiliary power source 110. The configuration 100 operates by allowing data to be stored in the SRAM 102 using a data bus (D), an address bus (A), a read/write control signal (R/W), and a chip select control signal (CS) in a conventional manner when a power supply (Vdd) is within a typical operating voltage range (e.g., 4.9-5.1 volts). In such a case, the voltage detector 108 detects that the power supply (Vdd) is within the typical operating voltage range (e.g., 4.9-5.1 volts) and controls the power switch 106 such that it is configured to connect the power supply (Vdd) to the SRAM 102. In this case, the voltage detector 108 also controls the signal switch 104 such that it is configured to connect the chip select control signal (CS) to the SRAM 102.

However, when the voltage detector 108 detects that the power supply (Vdd) is outside of the typical operating voltage range (e.g., 4.9-5.1 volts), it controls the power switch 106 such that it is configured to connect the auxiliary power source 110 to the SRAM 102, thereby allowing previously stored data to be retained in the SRAM 102. In this case, the voltage detector 108 also controls the signal switch 104 such that it is configured to disconnect the chip select control signal (CS) from the SRAM 102, thereby preventing corrupt data from being written to the SRAM 102.

The configuration 100 obviously requires multiple components, of which most are typically very expensive. For example, the SRAM 102 is much more expensive than a dynamic random access memory device (DRAM) of comparable storage size. Also, the auxiliary power source 110 typically comprises an expensive battery or very large capacitor, or both, for providing auxiliary power. Further, batteries have only a limited life, and capacitors typically degrade over time. Additionally, the combination of all of these components typically consume considerable physical circuit board space.

In view of the foregoing, it would be desirable to provide a high speed non-volatile electronic memory configuration which overcomes the above-described inadequacies and shortcomings in an efficient and cost effective manner.

SUMMARY OF THE INVENTION

According to the present invention, a high speed non-volatile electronic memory configuration and method is provided. In one particular exemplary embodiment, the high speed non-volatile electronic memory configuration may be realized comprising a high speed volatile memory, a non-volatile memory coupled to the high speed volatile memory, a controller coupled to the high speed volatile memory and the non-volatile memory, and a power level detector that detects when power is above a particular minimum operating voltage level. The controller monitors data storage changes made within the high speed volatile memory and controls the transfer of stored data from the high speed volatile memory to the non-volatile memory, and vice-versa, when power is above the particular minimum operating voltage level.

In accordance with other aspects of this particular exemplary embodiment of the present invention, the configuration may further beneficially comprise a power storage element that stores transient power for use by the high speed volatile memory, the non-volatile memory, and/or the controller when power is below the particular minimum operating voltage level. If such is the case, the controller may then beneficially control the transfer of stored data from the high speed volatile memory to the non-volatile memory for a limited period of time using the transient power stored by the power storage element when power is below the particular minimum operating voltage level. The power storage element may beneficially comprise bulk capacitance having a value in the hundreds of microfarads.

In accordance with further aspects of this particular exemplary embodiment of the present invention, the high speed volatile memory may beneficially comprise a high speed dynamic random access memory. If such is the case, the high speed volatile memory may beneficially be a high speed, dual port, dynamic random access memory, wherein the controller is coupled to a first port of the high speed, dual port, dynamic random access memory, and wherein both the controller and the non-volatile memory are coupled to a second port of the high speed, dual port, dynamic random access memory.

In accordance with additional aspects of this particular exemplary embodiment of the present invention, the high speed volatile memory may beneficially be a high speed, dual port, volatile memory, wherein the controller is coupled to a first port of the high speed, dual port, volatile memory, and wherein both the controller and the non-volatile memory are coupled to a second port of the high speed, dual port, volatile memory.

In accordance with still other aspects of this particular exemplary embodiment of the present invention, the non-volatile memory may beneficially be a low speed non-volatile memory relative to the high speed volatile memory. The non-volatile memory may beneficially be a non-volatile flash memory.

In accordance with still further aspects of this particular exemplary embodiment of the present invention, the controller may beneficially be, for example, a microprocessor, a microcontroller, a programmable processing device, or a fixed function processing device. The controller may beneficially prevent the transfer of stored data from the high speed volatile memory to the non-volatile memory, and vice-versa, when power is below the particular minimum operating voltage level. Also, the controller may beneficially control the transfer of stored data from the non-volatile memory to the high speed volatile memory immediately following a restoration of power to above the particular minimum operating voltage level. The power level detector may beneficially provide an indication to the controller that power is above the particular minimum operating voltage level.

In another particular exemplary embodiment, the present invention may be realized as a method for storing data comprising monitoring data storage changes made within a high speed volatile memory, permitting stored data to be transferred from the high speed volatile memory to a non-volatile memory, and vice-versa, based upon the monitored data storage changes when power is above a particular minimum operating voltage level, and preventing stored data to be transferred from the high speed volatile memory to the non-volatile memory, and vice-versa, when power is below the particular minimum operating voltage level.

In accordance with other aspects of this particular exemplary embodiment of the present invention, the method may further beneficially comprise detecting when power is above the particular minimum operating voltage level. If such is the case, the method may still further beneficially comprise providing an indication that power is above the particular minimum operating voltage level.

In accordance with further aspects of this particular exemplary embodiment of the present invention, the method may further beneficially comprise detecting when power is below the particular minimum operating voltage level. If such is the case, the method may still further beneficially comprise providing an indication that power is below the particular minimum operating voltage level. The method may then still further beneficially comprise providing a transient power when power is below the particular minimum operating voltage level, and permitting stored data to be transferred from the high speed volatile memory to a non-volatile memory based upon the monitored data storage changes for a limited period of time using the transient power when power is below the particular minimum operating voltage level.

In accordance with further aspects of this particular exemplary embodiment of the present invention, the method may further beneficially comprise controlling the transfer of stored data from the non-volatile memory to the high speed volatile memory immediately following a restoration of power to above the particular minimum operating voltage level.

The present invention will now be described in more detail with reference to exemplary embodiments thereof as shown in the accompanying drawings. While the present invention is described below with reference to exemplary embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the accompanying drawings, in which like elements are referenced with like numerals. These drawings should not be construed as limiting the present invention, but are intended to be exemplary only.

DETAILED DESCRIPTION OF EXEMPLARY EMBODIMENT(S)

Figure 1:
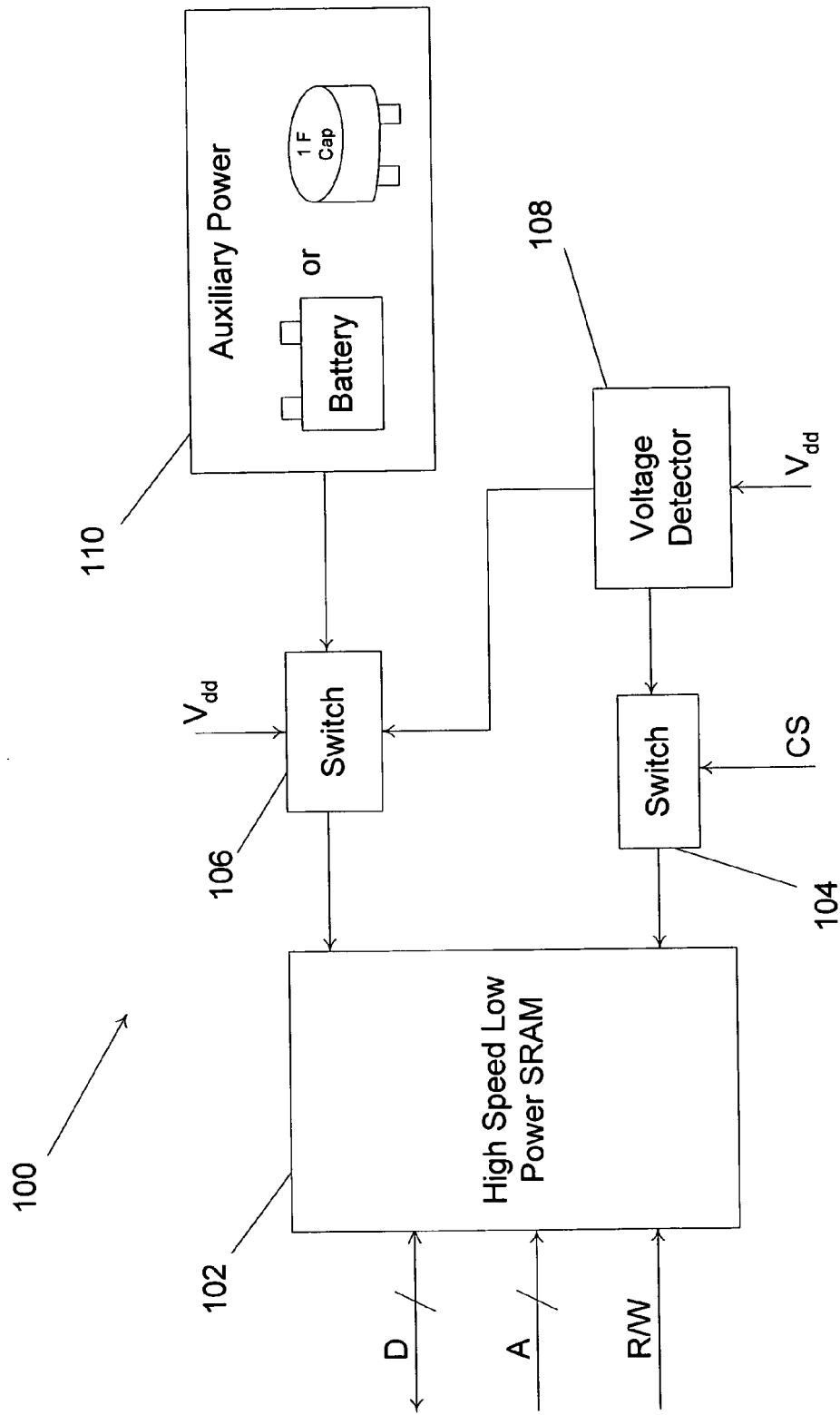
FIG. 1 shows a conventional non-volatile electronic memory configuration.
Figure 2:
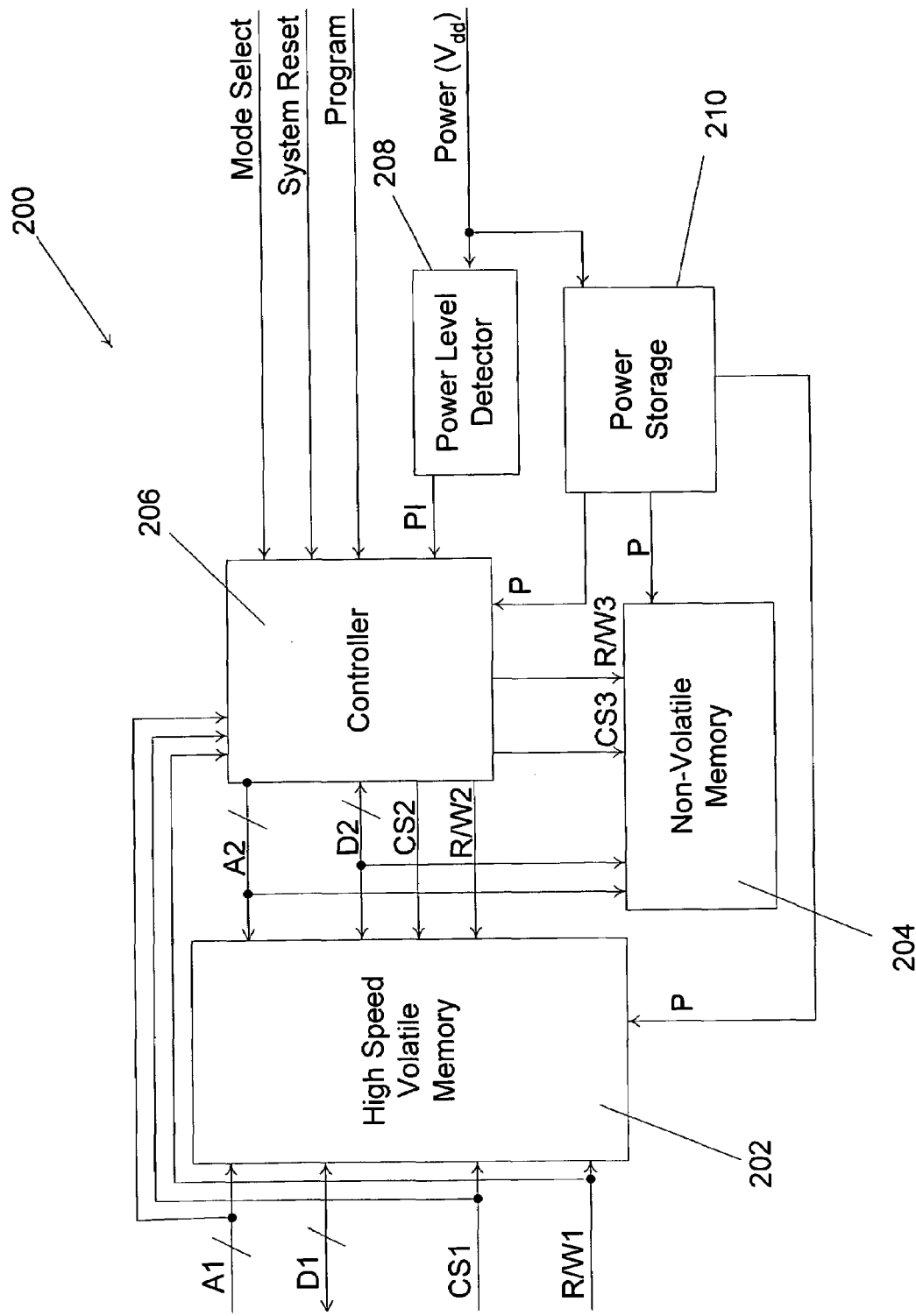
FIG. 2 shows a high speed non-volatile electronic memory configuration in accordance with an embodiment of the present invention.

Referring to FIG. 2, there is shown a high speed non-volatile electronic memory configuration 200 in accordance with an embodiment of the present invention. The configuration 200 comprises a high speed volatile memory 202, a non-volatile memory 204, a controller 206, a power level detector 208, and a power storage element 210.

The high speed volatile memory 202 may take one of several forms. For example, the high speed volatile memory 202 may be a high speed, dual port, dynamic random access memory (DRAM), wherein internal memory cells thereof may be accessed via two separate data buses, as shown in FIG. 2. The high speed volatile memory 202 could also be a high speed, single port, dynamic random access memory (DRAM), wherein internal memory cells thereof may be accessed via a single data bus. However, in the latter case, the high speed volatile memory 202 would have to be isolated from the rest of the system, as will be described in more detail below.

The non-volatile memory 204 may also take one of several forms. For example, the non-volatile memory 204 may be a non-volatile flash memory or any number of other types of non-volatile memory which operate to retain previously stored data without requiring the constant presence of a power source. Such non-volatile memory typically require a high voltage to initially store data therein. However, once the data is stored, it will be retained, even with a loss of power.

The controller 206 may further take one of several forms. For example, the controller 206 may be a microprocessor, a microcontroller, or some other programmable or fixed function processing device. The controller 206 operates to monitor a data bus (D1), an address bus (A1), and control signals (e.g., a read/write control signal (R/W1) and a chip select control signal (CS1)) that are applied to the high speed volatile memory 202 so as to keep track of any data storage changes made within the high speed volatile memory 202. The controller 206 also operates to control the transfer of stored data from the high speed volatile memory 202 to the non-volatile memory 204, and vice-versa, as described in more detail below. The controller 206 may accept multiple control signals (e.g., a mode select control signal (MODE SELECT), a system reset control signal (SYSTEM RESET), and a program control signal (PROGRAM)) for controlling the controller 206, as described in more detail below.

The power level detector 208 operates to detect whether the power supply (Vdd) is within or outside of a particular operating voltage range (e.g., 4.9-5.1 volts). When the power level detector 208 detects that the power supply. (Vdd) is within the particular operating voltage range (e.g., 4.9-5.1 volts), it provides an active power indicator signal (PI) to the controller 206. When the power level detector 208 detects that the power supply (Vdd) is outside the particular operating voltage range (e.g., 4.9-5.1 volts), it deactivates the power indicator signal (PI) to the controller 206. For purposes of the present invention, the power indicator signal (PI) may be active or inactive based upon whether the power supply (Vdd) is above or below a particular minimum operating voltage level (e.g., 4.9 volts), respectively.

The power storage element 210 operates to provide power (P) from the power supply (Vdd) to each of the high speed volatile memory 202, the non-volatile memory 204, and the controller 206. The power storage element 210 also operates to store transient power for use by the high speed volatile memory 202, the non-volatile memory 204, and/or the controller 206. This stored transient power may be used when the power supply (Vdd) is below a particular operating voltage level (e.g., 4.9 volts), or whenever the voltage level of the stored power is above the voltage level of the power supply (Vdd). The power storage element 210 may be implemented with bulk capacitance having a value, for example, in the hundreds of microfarads.

The configuration 200 operates such that the controller 206 allows data to be stored in the high speed volatile memory 202 using the data bus (D1), the address bus (A1), the read/write control signal (R/W1), and the chip select control signal (CS1) in a conventional manner when the power supply (Vdd) is above a particular operating voltage level (e.g., 4.9 volts). In such a case, the power level detector 208 detects that the power supply (Vdd) is above the particular operating voltage level (e.g., 4.9 volts) and provides the active power indicator signal (PI) to the controller 206. Based upon the active power indicator signal (PI), the controller 206 allows data to be stored in the high speed volatile memory 202 in the conventional manner by not blocking such data storage to the high speed volatile memory 202. Based upon the active power indicator signal (PI), the controller 206 also monitors the data bus (D1), the address bus (A1), the read/write control signal (R/W1), and the chip select control signal (CS1) that are applied to the high speed volatile memory 202 so as keep track of any data storage changes made within the high speed volatile memory 202. Then, during periods in which the high speed volatile memory 202 is not being accessed via the data bus (D1), the address bus (A1), the read/write control signal (R/W1), and the chip select control signal (CS1), the controller 206 controls the transfer of stored data from the high speed volatile memory 202 to the non-volatile memory 204 using a data bus (D2), an address bus (A2), a pair of read/write control signals (R/W2 and R/W3), and a pair of chip select control signals (CS2 and CS3). That is, based upon the data storage changes that have been made within the high speed volatile memory 202, which are known by the controller 206 through its monitoring of the high speed volatile memory 202, the controller 206 controls the address bus (A2), the pair of read/write control signals (R/W2 and R/W3), and the pair of chip select control signals (CS2 and CS3) so as to simultaneously read changed stored data from the high speed volatile memory 202 and write the same changed stored data to the non-volatile memory 204 using the data bus (D2). Thus, the non-volatile memory 204 will essentially always have the same stored data as that of the high speed volatile memory 202.

At this point its should be noted that the controller 206 is able to read or write data directly from or to either the high speed volatile memory 202 or the non-volatile memory 204 since the controller 206 is coupled to the data bus (D2) and the controller 206 controls the address bus (A2), the pair of read/write control signals (R/W2 and R/W3), and the pair of chip select control signals (CS2 and CS3). Thus, the controller 206 may read data directly from either the high speed volatile memory 202 or the non-volatile memory 204 for later writing to either the non-volatile memory 204 or the high speed volatile memory 202, respectively.

At this point it should be noted that, although the high speed volatile memory 202 is shown in FIG. 2 as a high speed dual port memory volatile memory, as mentioned above, the high speed volatile memory 202 could also be a high speed, single port, volatile memory, wherein internal memory cells thereof may be accessed via a single data bus. In such a case, the data bus (D1), the address bus (A1), the read/write control signal (R/W1), and the chip select control signal (CS1) would have to be isolated from the high speed volatile memory 202 via a multiplexing scheme so as to allow similar control signals from the controller 206 to control the high speed volatile memory 202.

As described above, when the power level detector 208 detects that the power supply (Vdd) is below the particular operating voltage level (e.g., 4.9 volts), it deactivates the power indicator signal (PI) to the controller 206. Based upon the deactivated power indicator signal (PI), the controller 206 blocks access to the high speed volatile memory 202 via the data bus (D1), the address bus (A1), the read/write control signal (R/W1), and the chip select control signal (CS1). The controller 206 may block such access to the high speed volatile memory 202 in any number of ways. For example, the controller 206 may assert a continuous chip select control signal (CS2) to the high speed volatile memory 202. Alternatively, the controller 206 may disable the chip select control signal (CS1) be either sinking or sourcing sufficient current such that the chip select control signal (CS1) is in an inactive state.

Based upon the deactivated power indicator signal (PI), the controller 206 also operates to control the transfer of any remaining stored data from the high speed volatile memory 202 to the non-volatile memory 204. The controller 206 may perform this "last gasp" data transfer since the high speed volatile memory 202, the non-volatile memory 204, and the controller 206 are all operating using the stored transient power of the power storage element 210. This stored transient power of the power storage element 210 is chosen so as to allow the high speed volatile memory 202, the non-volatile memory 204, and the controller 206 to operate at a power level that is above the particular operating voltage level (e.g., 4.9 volts) for a sufficient period of time to allow the "last gasp" transfer of any remaining stored data from the high speed volatile memory 202 to the non-volatile memory 204.

Once power is restored, and the power level detector 208 detects that the power supply (Vdd) is again above the particular operating voltage level (e.g., 4.9 volts), the power level detector 208 reactivates the power indicator signal (PI) to the controller 206. Based upon the reactivated power indicator signal (PI), the controller 206 operates to control the transfer of stored data from the non-volatile memory 204 to the high speed volatile memory 202 using the data bus (D2), the address bus (A2), the pair of read/write control signals (R/W2 and R/W3), and the pair of chip select control signals (CS2 and CS3). That is, since data stored in the non-volatile memory 204 is not corrupted by a loss or reduction in power, the non-volatile memory 204 will have retained all data that was previously transferred thereto from the high speed volatile memory 202. Thus, the controller 206 may then control the address bus (A2), the pair of read/write control signals (R/W2 and R/W3), and the pair of chip select control signals (CS2 and CS3) so as to simultaneously read stored data from the non-volatile memory 204 and write the same stored data to the high speed volatile memory 202 using the data bus (D2). Thus, the high speed volatile memory 202 may be restored with the same data that was stored therein prior to any loss or reduction in power.

At this point it should be noted that, as previously mentioned, the controller 206 may accept multiple control signals (e.g., a mode select control signal (MODE SELECT), a system reset control signal (SYSTEM RESET), and a program control signal (PROGRAM)) for controlling the controller 206. For example, the mode select control signal (MODE SELECT) shown in FIG. 2 may switch the controller 206 between different modes of operation. For instance, in one mode (e.g., MODE SELECT=logic "0") the controller 206 may attempt to perform a "last gasp" data transfer, while in another mode (e.g., MODE SELECT=logic "1") the controller 206 may not attempt to perform a "last gasp" data transfer.

The controller 206 may also accept a system reset control signal (SYSTEM RESET), as shown in FIG. 2. The system reset control signal (SYSTEM RESET) may instruct the controller 206 to perform an initialization process within the controller 206.

The controller 206 may also accept a program control signal (PROGRAM), as shown in FIG. 2. The program control signal (PROGRAM) may instruct the controller 206 to submit to a programming process within the controller 206 wherein the operating code of the controller 206 is updated or replaced.

At this point it should be noted that the configuration 200 may be implemented in integrated circuit form, thereby allowing further benefits in terms of circuit board area savings, as well as reliability. In such a case, the power storage element 210 could be implemented off-chip to decrease die size.

The present invention is not to be limited in scope by the specific embodiments described herein. Indeed, other various embodiments of and modifications to the present invention, in addition to those described herein, will be apparent to those of ordinary skill in the art from the foregoing description and accompanying drawings. Thus, such other embodiments and modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breadth and spirit of the present invention as disclosed herein.

The invention claimed is:

1. A non-volatile electronic memory configuration comprising:
   a volatile memory having a first port and a second port;
   a non-volatile memory coupled to the second port of the volatile memory;
   a controller coupled to both the first port and the second port of the volatile memory and the non-volatile memory to monitor data storage changes made within the volatile memory and control the transfer of stored data from the volatile memory to the non-volatile memory, and vice-versa, based upon the monitored data storage changes when power is above a particular minimum operating voltage level; and
   a power level detector that detects when power is above the particular minimum operating voltage level.

2. The configuration of claim 1, further comprising:
   a power storage element that stores transient power for use by at least one of the volatile memory, the non-volatile memory, and the controller when power is below the particular minimum operating voltage level.

3. The configuration of claim 2, wherein the controller controls the transfer of stored data from the volatile memory to the non-volatile memory based upon the monitored data storage changes for a limited period of time using the transient power stored by the power storage element when power is below the particular minimum operating voltage level.

4. The configuration of claim 2, wherein the power storage element comprises bulk capacitance having a value in the hundreds of microfarads.

5. The configuration of claim 1, wherein the volatile memory is a dynamic random access memory.

6. The configuration of claim 1, wherein the controller monitors data storage changes made within the volatile memory via the first port.

7. The configuration of claim 1, wherein the controller controls the transfer of stored data from the second port of the volatile memory to the non-volatile memory.

8. The configuration of claim 1, wherein the non-volatile memory operates at a lower speed than the volatile memory.

9. The configuration of claim 1, wherein the non-volatile memory is a non-volatile flash memory.

10. The configuration of claim 1, wherein the controller is one of a microprocessor, a microcontroller, a programmable processing device, and a fixed function processing device.

11. The configuration of claim 1, wherein the controller prevents the transfer of stored data from the volatile memory to the non-volatile memory, and vice-versa, when power is below the particular minimum operating voltage level for more than a limited period of time.

12. The configuration of claim 1, wherein the controller controls the transfer of stored data from the non-volatile memory to the volatile memory immediately following a restoration of power to above the particular minimum operating voltage level.

13. The configuration of claim 1, wherein the power level detector provides an indication to the controller that power is above the particular minimum operating voltage level.

14. A method for controlling data storage, the method comprising:
   monitoring data storage changes made within a volatile memory having a first port and a second port, wherein the data storage changes made within the volatile memory via the first port are monitored;
   controlling the transfer of stored data from the second port of the volatile memory to a non-volatile memory, and vice-versa, based upon the monitored data storage changes when power is above a particular minimum operating voltage level; and preventing stored data from being transferred from the second port of the volatile memory to the non-volatile memory, and vice-versa, when power is below the particular minimum operating voltage level.

15. The method of claim 14, further comprising:

detecting when power is above the particular minimum operating voltage level.

16. The method of claim 15, further comprising:

providing an indication that power is above the particular minimum operating voltage level.

17. The method of claim 14, further comprising:

detecting when power is below the particular minimum operating voltage level.

18. The method of claim 17, further comprising:

providing an indication that power is below the particular minimum operating voltage level.

19. The method of claim 18, further comprising:

providing a transient power when power is below the particular minimum operating voltage level; and controlling the transfer of stored data from the second port of the volatile memory to the non-volatile memory based upon the monitored data storage changes for a limited period of time using the transient power when power is below the particular minimum operating voltage level.

20. The method of claim 14, further comprising:

controlling the transfer of stored data from the non-volatile memory to the second port of the volatile memory immediately following a restoration of power to above the particular minimum operating voltage level.

* * * * *